United States Patent
Yu et al.

(10) Patent No.: US 10,521,536 B2
(45) Date of Patent: Dec. 31, 2019

(54) RTL VERIFICATION USING COMPUTATIONAL COMPLEXITY-BASED PROPERTY RANKING AND SCHEDULING

(71) Applicant: Synopsys, Inc., Mountain View, CA (US)

(72) Inventors: Jinqing Yu, Fremont, CA (US); Manish Pandey, Saratoga, CA (US); Ming-Ying Chung, Cupertino, CA (US); Arunava Saha, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 101 days.

(21) Appl. No.: 15/817,025

(22) Filed: Nov. 17, 2017

(65) Prior Publication Data

US 2018/0144071 A1    May 24, 2018

Related U.S. Application Data

(60) Provisional application No. 62/425,064, filed on Nov. 21, 2016.

(51) Int. Cl.
*G06F 17/50* (2006.01)
*G06N 99/00* (2019.01)
*G06N 20/00* (2019.01)

(52) U.S. Cl.
CPC .......... *G06F 17/504* (2013.01); *G06N 20/00* (2019.01)

(58) Field of Classification Search
CPC .................. G06F 17/504; G06N 99/005
USPC .......................... 716/101, 106, 111
See application file for complete search history.

(56) References Cited

U.S. PATENT DOCUMENTS

| | | | |
|---|---|---|---|
| 5,433,798 A * | 7/1995 | Takano et al. | C22C 38/001 148/325 |
| 5,723,391 A * | 3/1998 | Hunter et al. | C30B 29/36 501/86 |
| 6,077,304 A * | 6/2000 | Kasuya | G06F 17/5022 703/14 |
| 2013/0169961 A1 * | 7/2013 | Kraft | E21C 41/30 356/318 |
| 2017/0024508 A1 * | 1/2017 | Mneimneh et al. | G06F 17/5081 |
| 2017/0185602 A1 * | 6/2017 | Gusev et al. | G06N 7/005 |

OTHER PUBLICATIONS

Li, Hang, "A Short Introduction to Learning to Rank," Special Section on Information-Based Induction Sciences and Machine Learning, IEICE Trans. Inf. & Syst., vol. E94-D, No. 10, Oct. 2011, pp. 1854-1962 (9 pages).

* cited by examiner

*Primary Examiner* — Sun J Lin
(74) *Attorney, Agent, or Firm* — HIPLegal LLP; Judith Szepesi (57) ABSTRACT

A method or apparatus comprising a verification system using a processor to utilize a first set of verification engines to solve easy properties of an integrated circuit design, such as RTL, running a machine-learning algorithm for a hardness ranking analysis on a plurality of properties based on data from the first set of verification engines, and ranking the plurality of properties by a hardness of verification. The method or apparatus further to order the plurality of properties based on the hardness of verification.

18 Claims, 9 Drawing Sheets

| FEATURE | DESCRIPTION |
|---|---|
| OrigNumVars | Number of variables in original CNF formula before any unrolling during Bounded Model Checking |
| OrigNumClauses | Number of clauses in original CNF formula before any unrolling during Bounded Model Checking |
| nVars | Number of variables in CNF formula after certain cycles of unrolling during Bounded Model Checking |
| nClauses | Number of clauses in CNF formula after certain cycles of unrolling during Bounded Model Checking |
| varClauseRatio | Ratio between nVars and nClauses |
| decisionCount | Number of decisions in SAT solvers |
| conflictCount | Number of conflicts in SAT solvers |
| nBadStates | Number of states which can reach to any bad state after one transition |
| nProofObl | Number of proof obligations |
| lClauseVarRatio | Ratio between number of learnt clauses and nVars |

Fig. 8

RTL VERIFICATION USING COMPUTATIONAL COMPLEXITY-BASED PROPERTY RANKING AND SCHEDULING

RELATED APPLICATION

The present application claims priority to U.S. Provisional Application No. 62/425,064 filed on Nov. 21, 2016, and incorporates that application by reference.

FIELD

The present invention relates to RTL verification, and more particularly to hardness ranking for properties in verification.

BACKGROUND

In formal verification, a tool needs to solve a set of properties, such as System Verilog assertions (SVAs). These properties are either automatically generated by the tool, manually specified by the tool user, or provided in some other way.

Given a fixed computational resource budget (CPU time, memory, number of available machines), the formal tool's performance is measured by the number of properties solved within the resource budget. Properties not solved at the end of the execution will have a timed out status.

To maximize the tool's throughput, it is advantageous to schedule the properties such that easier properties are solved first. However, it is a very challenging problem to estimate the hardness of properties without actually solving the problem.

One prior art method of estimating is calculating the theoretical upper bound of formal property, which gives an estimate of the hardness of the property. If there are m variables in the cone of influence (COI) logic of the properties, the upper bound estimates the CPU time to solve the property is in $O(2^m)$ using big-O notation. In a standard test case, a typical property can 50,000 variables or more. The value of $O(2^{50000})$ is a huge number. However, modern formal tools can often solve many properties within minutes or hours. This shows that the theoretical upper bound is too rough to be useful in practice, and does not correlate well to the empirical hardness.

Another prior art method of estimating empirical hardness uses ad-hoc heuristics. They are typically in the form of handcrafted formula based on a few feature variables, e.g., the number of input variables, the number of sequential state variables in the COI of the property. In these approaches, the empirical hardness of the property is modeled by some linear or non-linear functions, often done by a domain expert. Parameters in these functions are then fitted to the given data set using regression technique. Essentially, these approaches use linear regression techniques to approximate the empirical hardness of a property.

There are at least two major drawbacks with these ad-hoc heuristics. The first drawback is caused by "the limited feature set". These formulas are hand-crafted by a domain expert and typically only involve just a small number (<10) of feature variables, since formal properties with large number variables are very difficult for a human being to comprehend. The second drawback is caused by "the absolute objective function". These approaches try to estimate the empirical hardness of a property directly, i.e., they try to predict the actual CPU time required to solve a property. This is a highly non-linear objective function and hard to model with standard regression techniques. In practice, these heuristics often give low prediction accuracy on unseen examples and are not used in a formal product.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

The present invention utilizes a Machine Learning based approach to predict the relative hardness of properties of an integrated circuit design. In one embodiment, the integrated circuit design is a register transfer level (RTL) design. The properties are assertions that document the functionality of the design, verify that the intent of the design is met over the simulation period or exclusive functional verification, and determine whether the design is functionally correct according to its specification. In one embodiment, the properties may be SystemVerilog assertions. In one embodiment, the properties may be assertions generated and/or extracted automatically by formal verification tools. Assertion-Based verification improves the quality of the design, and reduces the design cycle. However, a complex design with a large number of properties may take too long to fully verify. By evaluating the hardness of the properties, and using this determination to sort the properties in an ascending hardness order, the present hardness-based machine learning system makes it possible to schedule easier properties first and maximize a verification tools' throughput. Hardness, in this context, refers to the difficulty of evaluating the property. Better throughput helps to catch design issues faster, fix them sooner, and improve overall turnaround time of circuit design.

In formal verification related products, formal properties are checked by the tool to see if they are proven to be true, or falsified with a counter example trace (waveform). Properties may also have timed-out/inconclusive result, if the tool runs out of computational time/memory during the check. In theory, the hardness of a formal property has exponential time upper bound with respect to the number variables in the cone-of-influence (COI) logic of the properties. In practice, the empirical hardness of a formal property can be measured by the smallest CPU time required by a formal tool to actually solve the property, concluding with either proven or falsified status. From a formal tool's perspective, the empirical property hardness is what is optimally used for ordering the properties. This invention solves the property ranking problem by a novel Pair-Wise Machine Learning method.

The following detailed description of embodiments of the invention refers to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

Figure 1A:
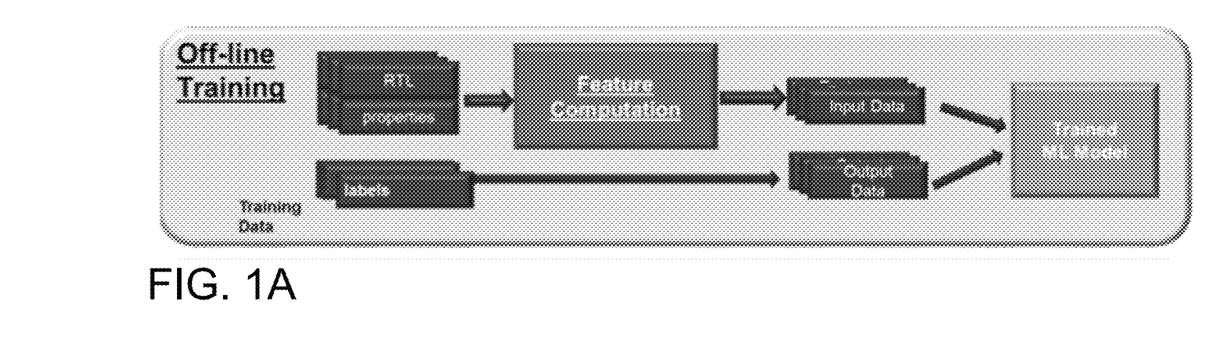
FIG. 1A illustrates one embodiment of an offline training mode.
Figure 1B:
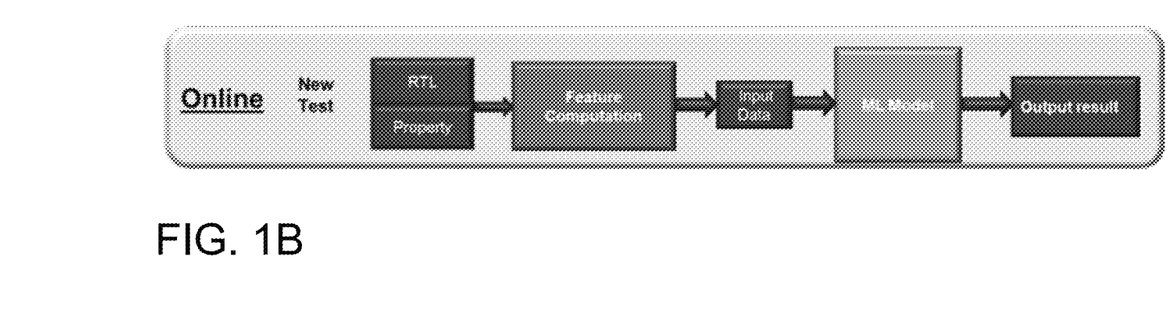
FIG. 1B illustrates one embodiment of an online prediction mode.

FIGS. 1A-1B are block diagrams showing embodiments of Supervised Machine Learning systems. A supervised machine learning technique can be informally described as a way to learn and approximate an unknown (arbitrarily complex) function f: y=f(X) using a training data set.

FIG. 1A illustrates one embodiment of offline training mode. Each data instance $(X_i, y_i)$ in the training data set satisfies the input-output relationship of the function $y_i = \bar{f}(X_i)$. The input tuple $X_i$ is a sequence of variables, where each variable is called a feature. Supervised Machine Learning uses the given training data to construct a model function $\bar{f}$ which is an approximation of the actual function $f$. In this context, the term "offline" means that the training mode is not deployed, but rather used as a preparatory step prior to making the Supervised Machine Learning system available for use as part of formal product.

Figure 8:
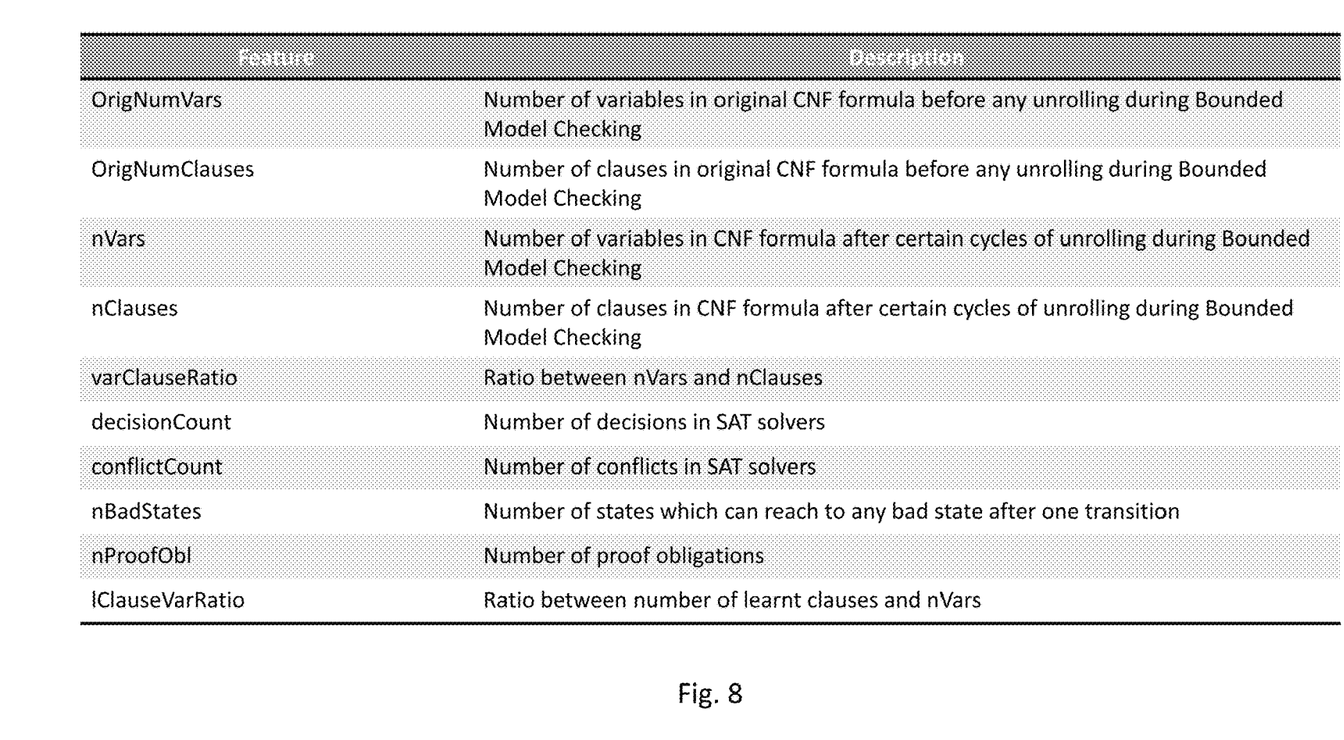
FIG. 8 illustrates a set of exemplary features that may be used in the system.

In one embodiment, the features refer to different parameters that are computed during property solving. In one embodiment, these parameters may be internal to the engine. FIG. 8 illustrates a set of exemplary features that may be used in the system. These features may include the number of variables (before and after unrolling), number of clauses (before and after unrolling). The features may also include the ratio between the variables and clauses, as well as ratios between other elements such as a ratio between the learned clauses and the number of variables. In one embodiment, the features may include the number of decisions and conflicts in the satisfiability (SAT) solvers. Other features may be more complex, such as the number of states which can reach a bad state after one transition, or the number of proof obligations.

FIG. 1B illustrates one embodiment of the online prediction mode. Once off-line training is completed, there is a trained Machine Learning Model. A trained Machine Learning Model, in an online mode, extracts feature data $X_j$ from a new test. The predicted output value $y_j$ is obtained by feeding the feature data $X_j$ to the model $\bar{f}$ which was built by off-line training. In this context, the term "online" means that the Supervised Machine Learning system is available for use, rather than being trained. Though of course the system may be continuously trained, as additional data sets are analyzed, and the results of that analysis are obtained.

Instead of utilizing an absolute hardness model, in one embodiment, the hardness-based machine learning tool uses a pair-wise hardness comparison model $f_{comp}: y = f_{comp}(X_1, X_2)$ This function compares the hardness of two properties, $X_1$ and $X_2$. The output of this function represents the relative hardness of a property with respect to other properties in the group. The feature variables, in one embodiment, are composed of two sets: $(X_1, X_2)$, one for each property in comparison. The properties are then ordered using this comparison function.

Instead of a handful set of features (<10) typically used in the prior art handcrafted methods, the hardness based Machine Learning Model is scalable in terms of number of features that can be analyzed and utilized. It allows the system to use a significant portion or all the feature data that may correlate to a property's empirical hardness.

In the training data, in one embodiment, for each formal backend engine/algorithm, the internal engine data that correlates to the engine's runtime is collected. In one experiment, over 300 features were collected using the hardness-based Machine Learning system (HBML system). In one embodiment, some of the internal engine data may be removed. In one embodiment, the not-needed, irrelevant, duplicate, and redundant features which do not improve the accuracy of a predictive model or may decrease the prediction accuracy are removed. Various feature selection algorithms (recursive feature elimination and feature importance ranking) may be applied for dimensionality reduction, to improve prediction accuracy. The removal of such data can also boost the performance by reducing the complexity of the model.

In one embodiment, the HBML system is part of one or more electronic design automation (EDA) tools and used to design, calibrate, and adjust circuit designs, and circuit blocks. An EDA flow can include multiple steps, and each step can involve using one or more EDA software tools. Some EDA steps and software tools are described below, with respect to FIG. 2. These examples of EDA steps and software tools are for illustrative purposes only and are not intended to limit the embodiments to the forms disclosed.

To illustrate the EDA flow, consider an EDA system that receives one or more high level behavioral descriptions of an IC device (e.g., in HDL languages like VHDL, Verilog, etc.) and translates ("synthesizes") this high level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (functional element). The models define performance parameters for the cells; e.g., parameters related to the operational behavior of the cells, such as power consumption, delay, transition time, and noise. The netlist and cell library are typically stored in computer readable media within the EDA system and are processed and verified using many well-known techniques.

Figure 1C:
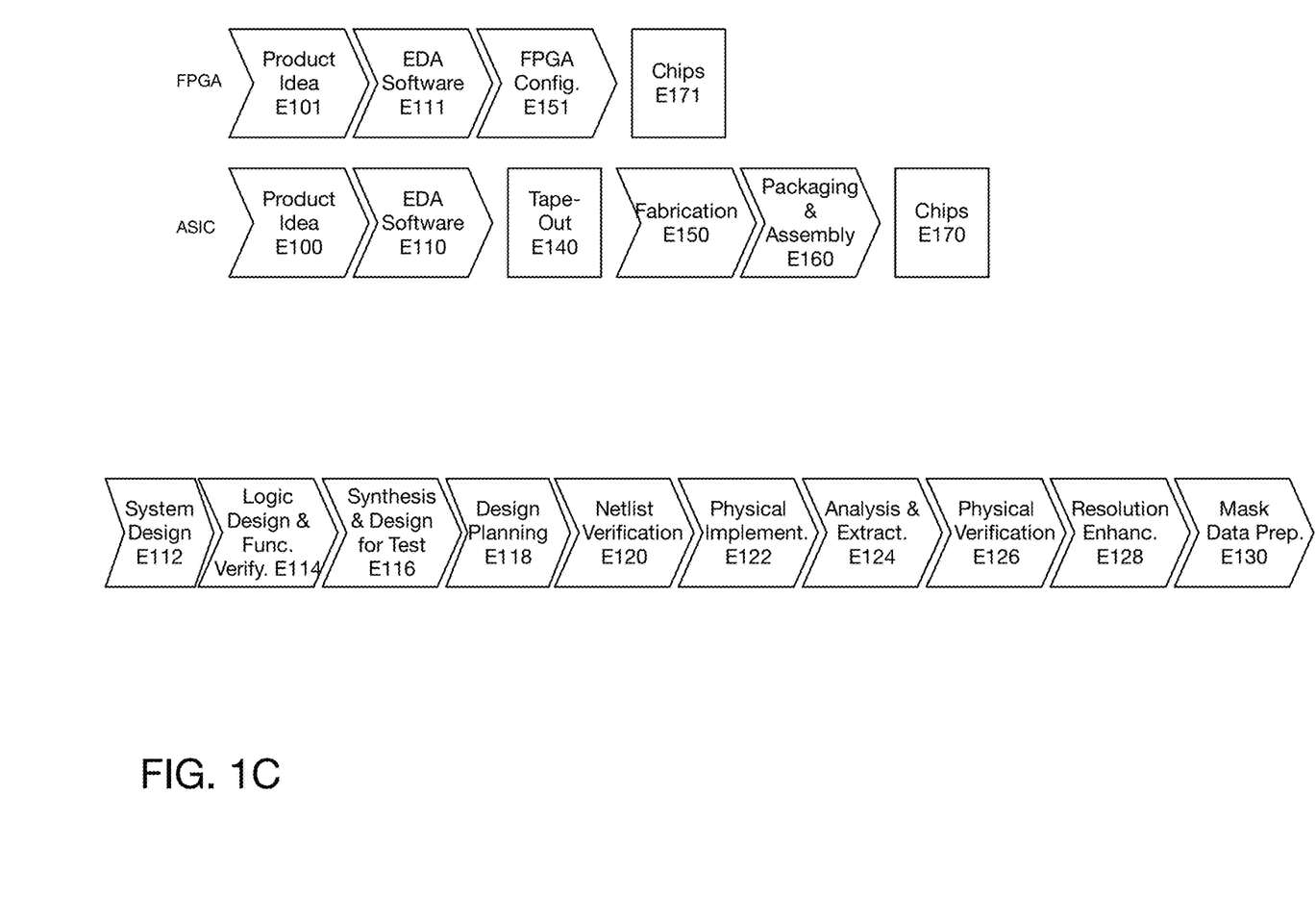
FIG. 1C is a diagram of one embodiment of an EDA design flow, in which the machine learning-based hardness prediction may be used.

Before proceeding further with the description, it may be helpful to place these processes in context. At a high level, for an application specific integrated circuit (ASIC), the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170). For a field programmable gate array (FPGA), the process starts with the product idea (step E101) and is realized in an EDA software design process (step E111). When the design is finalized, the FPGAs may be configured (event E151), applying the code to the FPGA circuits, resulting, ultimately, in finished chips (result E171).

The EDA software design process (step E110/E111) is actually composed of a number of steps E112-E130, shown in linear fashion for simplicity. In an actual design process, the particular design might have to go back through steps until certain tests are passed. Similarly, in any actual design process, these steps may occur in different orders and combinations. This description is therefore provided by way of context and general explanation rather than as a specific, or recommended, design flow for a particular circuit design.

A brief description of the components steps of the EDA software design process (step E110) will now be provided:

System design (step E112): The designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step E114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step E116): Here, the VHDL/Verilog is translated into a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Design planning (step E118): Here, an overall floorplan for the chip is constructed and analyzed for timing and top-level routing. Exemplary EDA software products from Synopsys, Inc. that can be used at this step include Jupiter and Floorplan Compiler products.

Netlist verification (step E120): At this step, the netlist is checked for compliance with timing constraints and for correspondence with the VHDL/Verilog source code. Exemplary EDA software products from Synopsys, Inc. that can be used at this step include VCS, VERA, Formality and PrimeTime products.

Physical implementation (step E122): The placement (positioning of circuit elements) and routing (connection of the same) occurs at this step. Exemplary EDA software products from Synopsys, Inc. that can be used at this step include the Astro product.

Analysis and extraction (step E124): At this step, the circuit function is verified at a transistor level, this in turn permits what-if refinement. Exemplary EDA software products from Synopsys, Inc. that can be used at this step include Star RC/XT, Raphael, and Aurora products. For FPGA design, in one embodiment the process ends here. Because FPGA programming is done through software, there are no physical configuration, resolution, and mask design issues.

For ASICS, next comes the Physical verification (step E126): At this step various checking functions are performed to ensure correctness for: manufacturing, electrical issues, lithographic issues, and circuitry. Exemplary EDA software products, Inc. that can be used at this step include the Hercules product.

Resolution enhancement (step E128): This step involves geometric manipulations of the layout to improve manufacturability of the design. Exemplary EDA software products from Synopsys, Inc. that can be used at this step include iN-Phase, Proteus, and AFGen products.

Mask data preparation (step E130): This step provides the "tape-out" data for production of masks for lithographic use to produce finished chips. Exemplary EDA software products from Synopsys, Inc. that can be used at this step include the CATS(R) family of products.

With respect to this application, in one embodiment, the HBML system may be used as part of the logic design and functional verification E114, for the verification of the RTL logic. In one embodiment, the HBML system may be used as part of netlist verification E120, after the RTL is synthesized into a netlist, and/or subsequently for and physical verification E126 elements.

Figure 2:
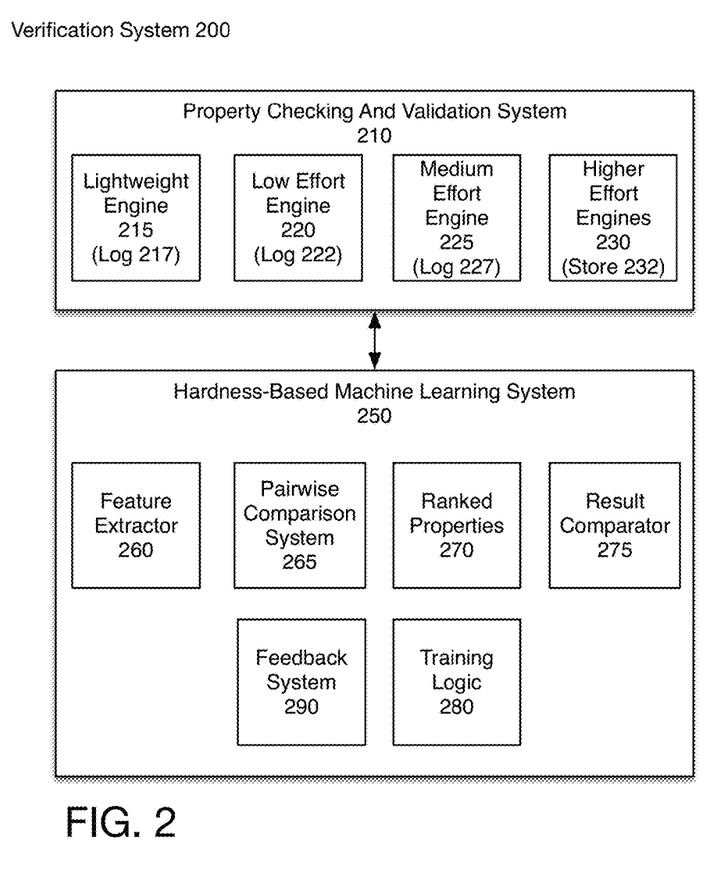
FIG. 2 is a block diagram of one embodiment of the verification system including the hardness-based machine learning system (HBML system).

FIG. 2 is a block diagram of one embodiment of the verification system including the hardness-based machine learning system (HBML system). The verification system 200 includes property checking and validation system 210 and hardness-based machine learning system 250.

The property checking and validation system 210 includes a lightweight engine 215, and one or more engines with additional levels of effort 220, 225. In one embodiment, the output from the hardness-based machine learning system 250 is a ranked list of properties. This is used as input to the higher effort engine 230, to prioritize solving the properties based on hardness. This increases throughput of the verification system 200.

The hardness-based machine learning system 250 includes a feature extractor to extract features from the logs received from property checking and validation system. The logs may be from light weight engine (log 217). The logs may also include logs from a low effort engine (log 222), and/or medium effort engine (log 227). The hardness-based machine learning system 250 is trained in the offline mode.

Pairwise Comparison system 265 compares pairs of properties, utilizing machine learning, to determine which property is harder. The sequence of pairwise comparisons results in a ranked set of properties 270. In one embodiment, this is a memory storing the ranked properties 270.

In one embodiment, the hardness-based machine learning system 250 includes a result comparator 275 which compares the hardness as evaluated by the higher effort engine(s) 230, with the ranked properties 270. In one embodiment, the result comparator 275, receives the actual hardness data from store 232 in one embodiment.

If the result comparator 275 determines that there is a difference between the ranking produced by the system 250 and the actual relative hardnesses, the training logic 280 may take the new data and provide additional training to the hardness-based machine learning system 250. In one embodiment, if the properties of the evaluated circuits differ from those used to train the system 250, the training logic 280 may take the new data and provide additional training to the hardness-based machine learning system 250. Training logic 280 in one embodiment includes data qualifier, which ensures that new data used to train the system increase accuracy.

In one embodiment, when additional training is used, it is provided as feedback 290 to the server system. This may propagate updated machine learning data, which does not disclose proprietary circuit information of customers but enables the continuous improvement of the hardness-based machine learning system 250.

Figure 3:
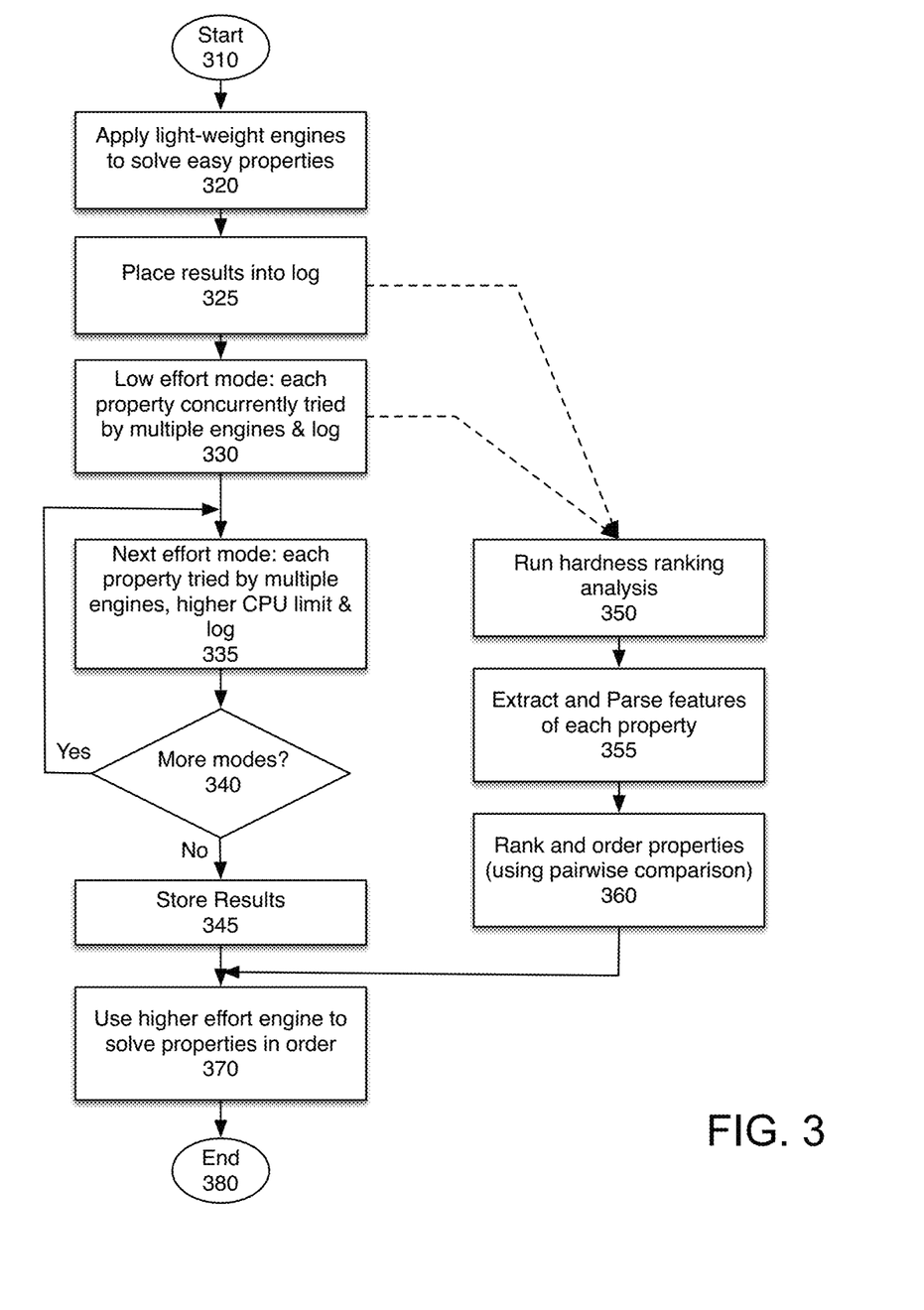
FIG. 3 is a flowchart of one embodiment of utilizing the system.

FIG. 3 is a flowchart of one embodiment of using the machine learning model. The process starts at block 310. In this flowchart, the portion of the flowchart on the left is the standard property verification tool process, with the features provided by the HBML system shown on the right. The left portion provides log files to the HBML, and the HBML responds with a property rank list.

At block 320, light-weight engines are applied to solve very easy properties. In one embodiment, the features extracted by the light-weight engines are placed into a log, at block 325.

The light-weight engine is followed, at block 330, by a low-effort mode, where each property is tried by multiple engines—scheduled concurrently—with a CPU limit. A CPU limit limits the amount of time that the process will permit for solving each property using the low-effort mode in the engine. In one embodiment, a default time is 32 seconds, for the multiple engines to solve the property.

At block 335, medium-effort mode is applied, where each property is tried by multiple engines, with a higher CPU limit. In one embodiment, the multiple engines may be scheduled concurrently. In one embodiment, the CPU limit for solving the properties using the medium-effort mode may be 10 minutes.

There may be additional levels of effort, with increasing times for the engines to solve the property. At block 340, the process determines whether there are additional levels of effort. If so, the process, at block 335 selects the next level of effort mode, with a higher CPU limit. This aspect of the process ends at block 345, when the verification results that have been extracted are stored.

In one embodiment, starting at block 350, which occurs concurrently with one of the effort levels, in one embodiment the medium-effort mode, the hardness ranking analysis is run. In another embodiment, the hardness ranking analysis may be run at any time after at least a first solving level has been applied—here referred to as the light-weight engine.

At block 355, the features of each property, identified by the engine(s) already applied are extracted and parsed. In one embodiment, the engine already applied is the light-weight engine. In one embodiment, this uses the engine logs, created at block 325, and optionally blocks 330, and 335 above. This means that the property verification process is not slowed by the insertion of the hardness analysis, because the features are extracted from the existing engine log files, and there is no need to rerun the engines to generate/compute features.

At block 360, the process ranks and orders the properties. In one embodiment, the ranking is done using a pairwise comparison machine learning model. In one embodiment, the system makes pair-wise comparisons among all the properties, and uses the model to predict which of each pair of properties is harder to solve. The process then ranks all properties by hardness.

This ordered set of properties are used by higher-effort mode engine(s), to solve the properties, at block 370. In one embodiment, the ordering of the properties is from easiest to hardest, for the higher-effort mode engines, to maximize the number of properties solved.

The process then ends, at block 380.

In one embodiment, the HBML system's machine learning model may be trained initially using in-house training data. To achieve good prediction accuracy, however, the training data set must be representative of new designs. Therefore, merely training the data once, and then deploying it is suboptimal. In one embodiment, the system provides adaptive and continuous learning at a customer site. In one embodiment, the system uses a server-based set-up, to provide adaptive and continuous learning.

Figure 4:
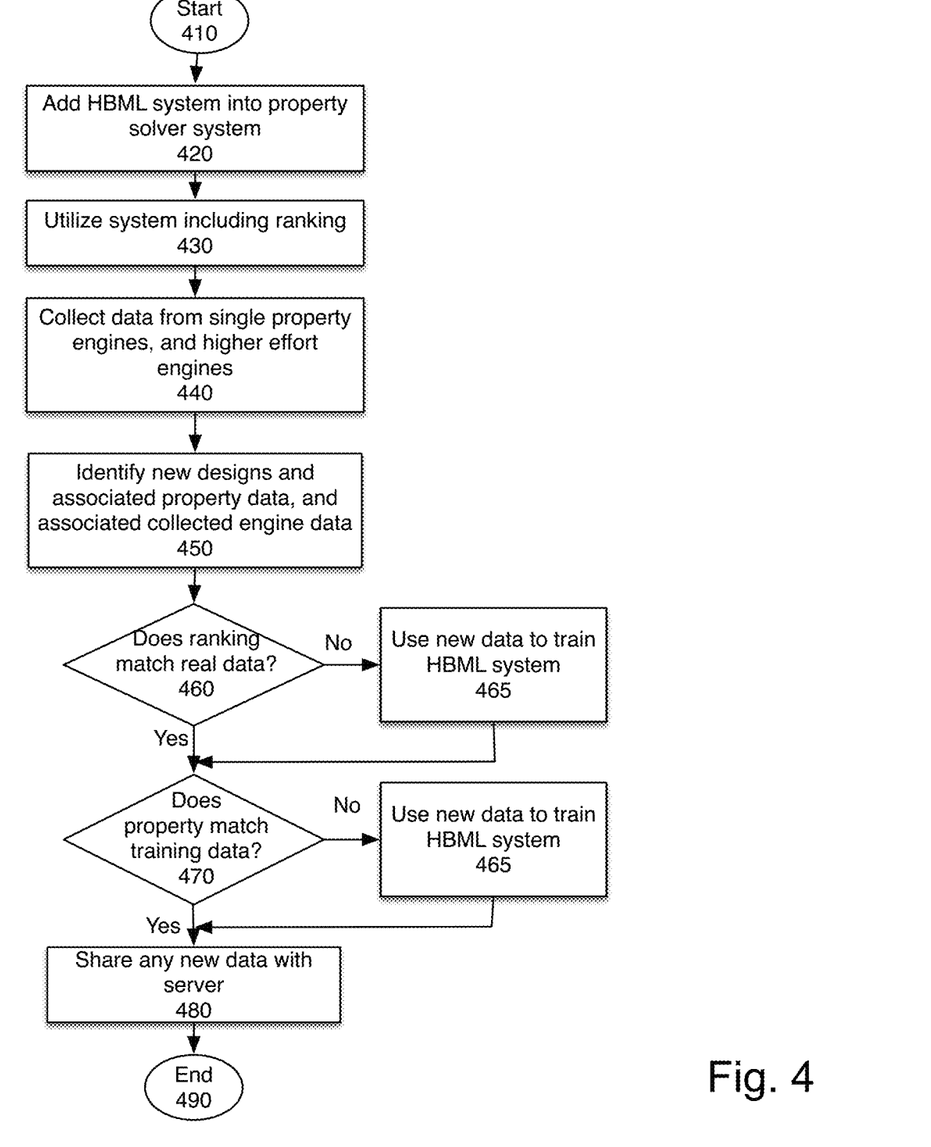
FIG. 4 is a flowchart of one embodiment of adaptive learning using the system.

FIG. 4 is a flowchart of one embodiment of the adaptive learning system for the HBML system.

The process starts at block 410. At block 420, a trained HBML system is added into the property solver system. The process then utilizes the system, including ranking, at block 430.

The results of the single property engines, in one embodiment the medium and higher effort engines, is collected, at block 440.

At block 450, new designs and associated property data is identified. This is associated with the results of the engines collected at block 440.

At block 460, evaluate whether the actual analysis results of hardness match the ranking produced by the HBML system. If not, in one embodiment, the system is trained with the new data, including rankings and newly collected property data at block 465. One embodiment of evaluating whether to retrain the system with the new data is described below in more detail with respect to FIG. 7.

At block 470, the process evaluates whether the designs and property data match the data used for training the HBML system. If not, the system is trained with the new data, at block 475.

At block 480, the resultant new design data may be shared with the home system. This enables the base training set to continuously be updated based on real-world data encountered at various customers' sites. The process then ends.

This server based methodology empowers the machine learning model to be adaptive to new designs at the customer site and be updated automatically. In one embodiment, the HBML system's onsite training is controlled by a qualification step which prevents the overfitting of the Machine Learning model to prevent degradation of predicted relative hardness.

Figure 7:
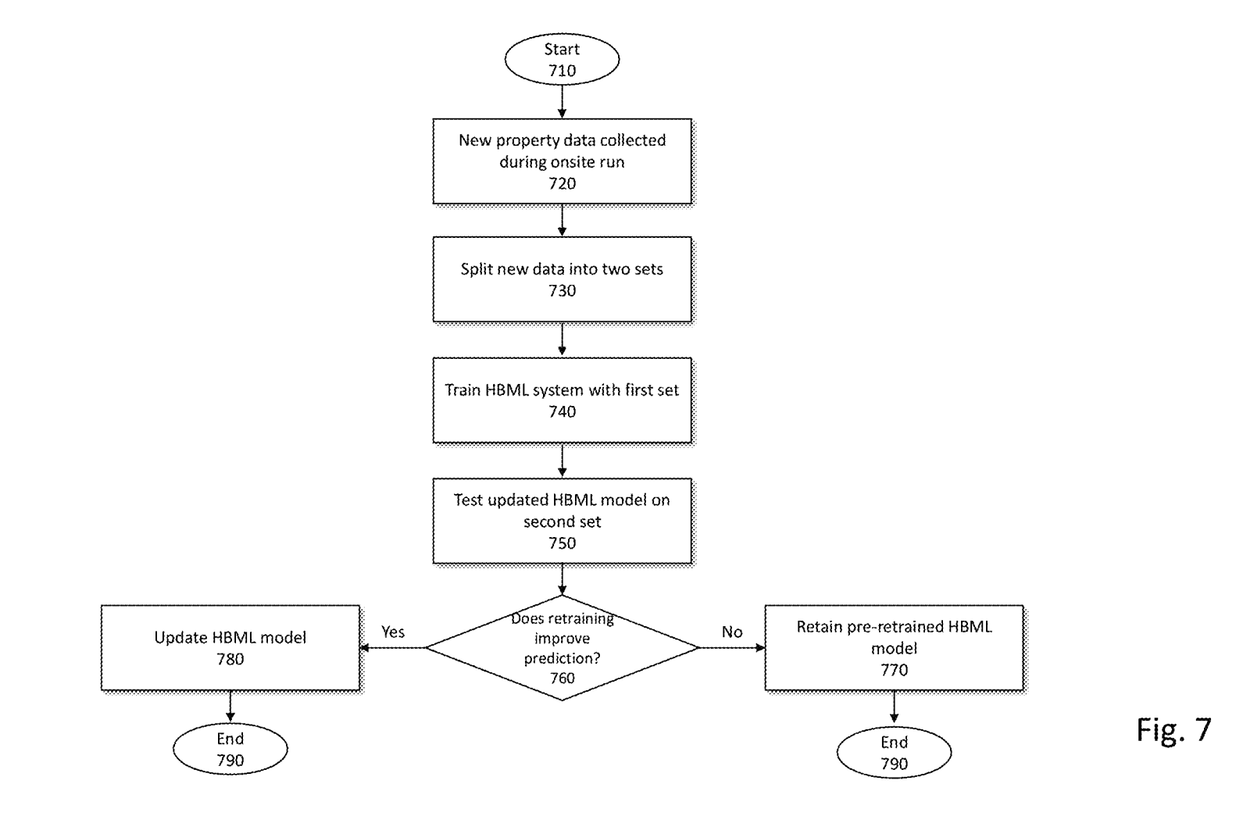
FIG. 7 is a flowchart of one embodiment of the intelligent qualification system for the HBML system.

FIG. 7 is a flowchart of one embodiment of the intelligent qualification system for the HBML system. This system starts at block 710. In one embodiment, this process corresponds to block 465 of FIG. 4, using the new data to train the system. However, instead of simply using the new data, FIG. 7 illustrates a method of qualifying the new data prior to adding it to the system.

At block 720, the new property data is collected from onsite runs. This step is equivalent to block 450 of FIG. 4.

At block 730, the new data is randomly split into two disjoint sets. As an example, 60% of new data is placed in one set and 40% in another set. The data is disjoint, meaning there is no overlap between the two data sets. The first set is the training set, and the second set is the testing set.

At block 740, HBML system is retrained on first set of new data. In one embodiment, the first set is 60% of the data.

At block 750, the new HBML model is tested on second set of new data. In one embodiment, the new HBML model is further tested with older data for validation.

At block 760, the process determines whether retraining has improved the HBML model, compared to the prior evaluation. In case of improvement, the process continues to block 780, and the new model is used in subsequent processes. Otherwise, the process continues to block 770, and the older HBML model is retained for better generalization across other new designs. This model qualification technique helps to prevent overfitting and improves generalization. Because training and testing is happening on disjoint data sets generated from same design, this generalizes the machine learning algorithm. Using this validation mechanism avoids unnecessary overfitting which can have a negative effect on the model after few iterations.

An embodiment of the HBML system was implemented and tested, and some experimental results are presented below. In this experiment, 80% of total 3000 hard properties are chosen as training properties to train the machine learning model, and the rest 20% properties are used as testing properties. The tool's throughput on the property order obtained from this ranking vs the default property order. is then analyzed.

Figure 5:
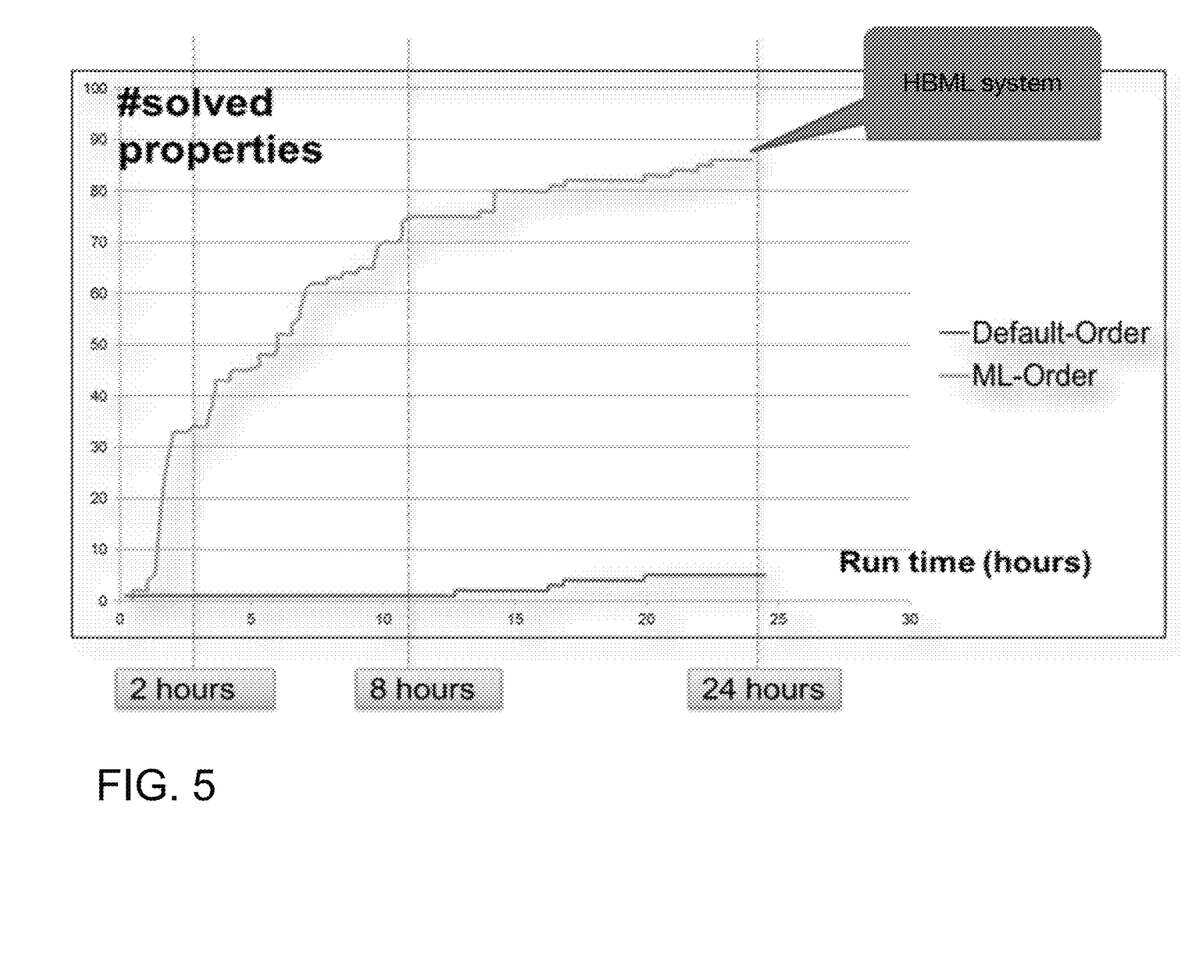
FIG. 5 is a diagram showing a relative improvement in solving speed using on the machine-learning based hardness ranking.

FIG. 5 shows the difference in the number of solved properties between the standard system and the HBML system in an exemplary implementation. The X-axis of shows the total runtime of the tool. The Y-axis shows the number of total properties solved. As is shown in FIG. 5, a 10×+ throughput improvement was achieved, based on the number of solved properties at CPU time 2 hours, 8 hours, and 24 hours.

Figure 6:
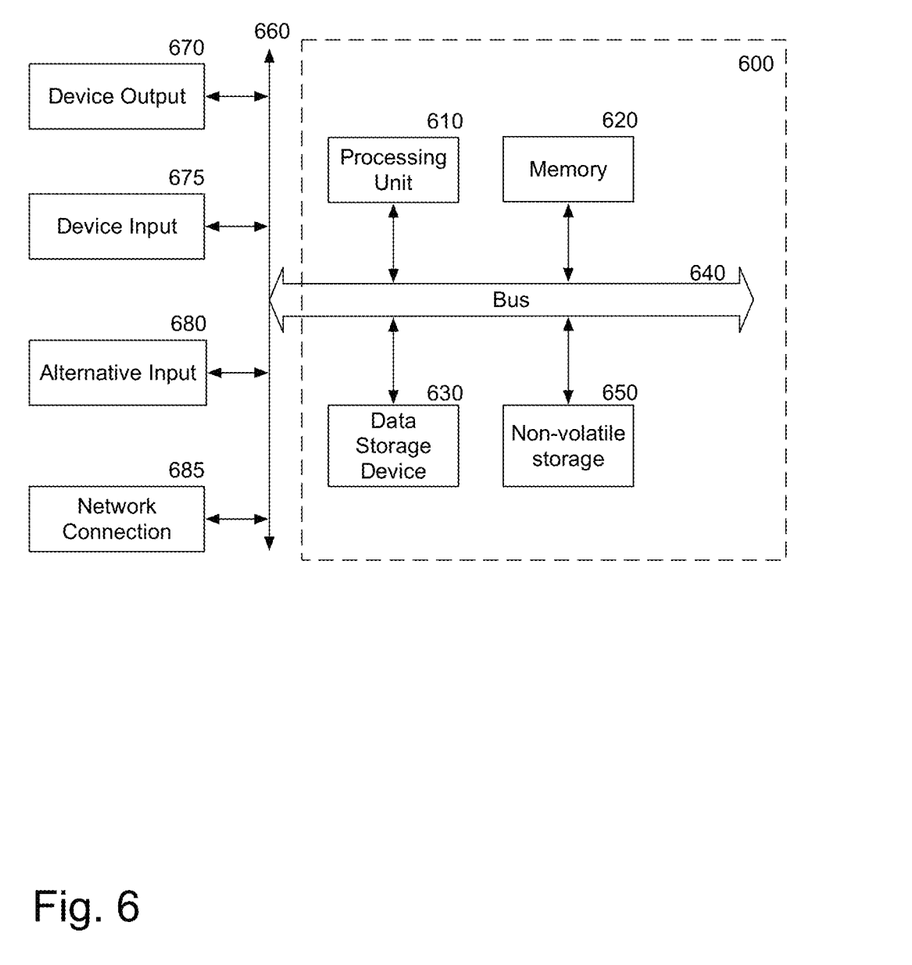
FIG. 6 is a block diagram of one embodiment of a computer system that may be used in the present invention.

FIG. 6 is a block diagram of one embodiment of a computer system that may be used with the present invention. It will be apparent to those of ordinary skill in the art, however that other alternative systems of various system architectures may also be used.

The data processing system illustrated in FIG. 6 includes a bus or other internal communication means 640 for communicating information, and a processing unit 610 coupled to the bus 640 for processing information. The processing unit 610 may be a central processing unit (CPU), a digital signal processor (DSP), or another type of processing unit 610.

The system further includes, in one embodiment, a random access memory (RAM) or other volatile storage device 620 (referred to as memory), coupled to bus 640 for storing information and instructions to be executed by processor 610. Main memory 620 may also be used for storing temporary variables or other intermediate information during execution of instructions by processing unit 610.

The system also comprises in one embodiment a read only memory (ROM) 650 and/or static storage device 650 coupled to bus 640 for storing static information and instructions for processor 610. In one embodiment, the system also includes a data storage device 630 such as a magnetic disk or optical disk and its corresponding disk drive, or Flash memory or other storage which is capable of storing data when no power is supplied to the system. Data storage device 630 in one embodiment is coupled to bus 640 for storing information and instructions.

The system may further be coupled to an output device 670, such as a cathode ray tube (CRT) or a liquid crystal display (LCD) coupled to bus 640 through bus 660 for outputting information. The output device 670 may be a visual output device, an audio output device, and/or tactile output device (e.g. vibrations, etc.)

An input device 675 may be coupled to the bus 660. The input device 675 may be an alphanumeric input device, such as a keyboard including alphanumeric and other keys, for enabling a user to communicate information and command selections to processing unit 610. An additional user input device 680 may further be included. One such user input device 680 is cursor control device 680, such as a mouse, a trackball, stylus, cursor direction keys, or touch screen, may be coupled to bus 640 through bus 660 for communicating direction information and command selections to processing unit 610, and for controlling movement on display device 670.

Another device, which may optionally be coupled to computer system 600, is a network device 685 for accessing other nodes of a distributed system via a network. The communication device 685 may include any of a number of commercially available networking peripheral devices such as those used for coupling to an Ethernet, token ring, Internet, or wide area network, personal area network, wireless network or other method of accessing other devices. The communication device 685 may further be a null-modem connection, or any other mechanism that provides connectivity between the computer system 600 and the outside world.

Note that any or all of the components of this system illustrated in FIG. 6 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 620, mass storage device 630, or other storage medium locally or remotely accessible to processor 610.

It will be apparent to those of ordinary skill in the art that the system, method, and process described herein can be implemented as software stored in main memory 620 or read only memory 650 and executed by processor 610. This control logic or software may also be resident on an article of manufacture comprising a computer readable medium having computer readable program code embodied therein and being readable by the mass storage device 630 and for causing the processor 610 to operate in accordance with the methods and teachings herein.

The present invention may also be embodied in a handheld or portable device containing a subset of the computer hardware components described above. For example, the handheld device may be configured to contain only the bus 640, the processor 610, and memory 650 and/or 620.

The handheld device may be configured to include a set of buttons or input signaling components with which a user may select from a set of available options. These could be considered input device #1 675 or input device #2 680. The handheld device may also be configured to include an output device 670 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 610, a data storage device 630, a bus 640, and memory 620, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through network device 685.

It will be appreciated by those of ordinary skill in the art that any configuration of the particular machine implemented as the computer system may be used according to the particular implementation. The control logic or software implementing the present invention can be stored on any machine-readable medium locally or remotely accessible to processor 610. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. In one embodiment, the control logic may be implemented as transmittable data, such as electrical, optical, acoustical or other forms of propagated signals (e.g. carrier waves, infrared signals, digital signals, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A method of improving a computer-aided integrated circuit design, the method comprising:
   a verification system using a processor to utilize a first set of verification engines to solve easy properties of an integrated circuit design;
   running a machine-learning algorithm for a hardness ranking analysis on a plurality of properties based on data from the first set of verification engines;
   ranking the plurality of properties by a hardness of verification; and
   ordering the plurality of properties based on the hardness of verification; and
   applying higher effort engines to solve the plurality of properties in accordance with the ordering of the hardness of verification.

2. The method of claim 1, wherein the hardness ranking analysis performs a pairwise comparison of properties.

3. The method of claim 1, wherein the hardness ranking analysis utilizes a machine learning model to compare the plurality of properties in a pairwise comparison.

4. The method of claim 1, further comprising:
   utilizing a low effort mode to test each property concurrently by multiple engines; and
   utilizing logs of the multiple engines implementing the low effort mode in the hardness ranking analysis.

5. The method of claim 1, wherein the hardness ranking analysis comprises:
   extracting features on each property from the first set of verification engines;
   selecting two properties;
   utilizing a pairwise comparison to predict which of the two properties is harder to solve, and ranking the two properties;
   determining whether there are any more comparisons to be made; and
   when there are no more comparisons to be made, logging the ranked two properties.

6. The method of claim 1, further comprising:
   collecting new property data when a machine learning model is running;
   determining that the machine learning model is not accurate for the new property data; and
   retraining the machine learning model with the new property data for a future use.

7. The method of claim 6, further comprising:
   evaluating the retraining of the machine learning model with the new property data; and
   updating the machine learning model when the retraining produces a more accurate machine learning model.

8. A computer-aided verification system for an integrated circuit design, the system comprising:
   a machine learning system configured to receive an integrated circuit design including a plurality of properties;
   a processor implementing a verification system to utilize a first set of verification engines to solve easy properties of an integrated circuit design;
   a machine-learning algorithm to perform a hardness ranking analysis on the plurality of properties based on data from the first set of verification engines, and to rank the plurality of properties by a hardness of verification;
   a memory to store an ordered set of the plurality of properties based on the hardness of verification; and
   applying higher effort engines to solve the plurality of properties in accordance with the ordered set of the plurality of properties based on the hardness of verification.

9. The system of claim 8, wherein the hardness ranking analysis performs a pairwise comparison of properties.

10. The system of claim 8, wherein the hardness ranking analysis utilizes the machine learning system to compare the plurality of properties in a pairwise comparison.

11. The system of claim 8, further comprising:
    the processor to apply a low effort mode to test each of the plurality of properties concurrently by multiple engines; and
    a memory to store logs of the first set of verification engines; and
    the machine-learning algorithm further to utilize the logs of the first set of verification engines utilizing the low effort mode in the hardness ranking analysis.

12. The system of claim 8, wherein the hardness ranking analysis comprises:
    a feature extractor to extract features on each property of the plurality of properties from the first set of verification engines;
    a comparison system to select two properties and utilize a pairwise comparison to predict which of the two properties is harder to solve, and ranking the two properties; and
    when there are no more comparisons to be made, the comparison system to log the ranked two properties.

13. The system of claim 8, further comprising:
    the system to collect new property data when a collector is running;
    a result comparator to determine that the system is not accurate for the new property data; and
    a training logic to retrain the system with the new property data for a future use.

14. The system of claim 13, further comprising:

wherein the training logic is configured to evaluate training of the system with the new property data and update the machine learning model when the retrained system produces a more accurate machine learning model.

15. The system of claim 8, wherein the plurality of properties comprise SystemVerilog assertions.

16. A hardness based machine learning (HBML) system to verify an integrated circuit design, the system comprising:

a machine learning system to receive an integrated circuit design including a plurality of properties;

a processor implementing a verification system to utilize a first set of verification engines to solve easy properties of an integrated circuit design;

a machine-learning algorithm to perform a hardness ranking analysis on the plurality of properties using a plurality of pairwise comparisons based on data from the first set of verification engines, and ranking the plurality of properties by a hardness of verification;

a memory to store an ordered set of the plurality of properties based on the hardness of verification; and applying higher effort engines to solve the plurality of properties in accordance with the ordered set of the plurality of properties based on the hardness of verification.

17. The system of claim 16, wherein:

the processor configured to apply a low effort mode to test each property concurrently by multiple engines;

a memory configured to store a log of the first set of verification engines; and the machine-learning algorithm further configured to utilize the log of the first set of verification engines and the low effort mode in the hardness ranking analysis.

18. The system of claim 16, wherein the hardness ranking analysis is performed using components comprising:

a feature extractor to extract features on each property from the first set of verification engines; and a comparison system to select the two properties and utilize a pairwise comparison to predict which of two properties is harder to solve, and rank the two properties, when there are no more comparisons to be made, the comparison system configured to log the ranked two properties.

* * * * *